USOO6809618B2

United States Patent
Leghissa et al.

(10) Patent No.: US 6,809,618 B2
(45) Date of Patent: Oct. 26, 2004

(54) SWITCHING DEVICE FOR SUPERCONDUCTING TECHNOLOGY

(75) Inventors: Martino Leghissa, Forchheim (DE); Marijn Oomen, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/342,343

(22) Filed: Jan. 15, 2003

(65) Prior Publication Data

US 2004/0189427 A1 Sep. 30, 2004

(30) Foreign Application Priority Data

Jan. 15, 2002 (DE) ........................................ 102 01 322

(51) Int. Cl.[7] ............................................... H01F 6/00
(52) U.S. Cl. .................... 335/216; 174/125.1
(58) Field of Search ................ 335/216, 300; 62/50.1

(56) References Cited

U.S. PATENT DOCUMENTS

| | | | | |
|---|---|---|---|---|
| 4,854,128 A | * | 8/1989 | Zeamer ...................... | 62/50.1 |
| 5,350,739 A | | 9/1994 | Martens et al. | |
| 5,394,129 A | * | 2/1995 | Obasih et al. ............... | 335/216 |
| 5,680,085 A | * | 10/1997 | Aihara et al. ............... | 335/216 |
| 5,805,036 A | | 9/1998 | Hodge et al. | |
| 6,112,530 A | * | 9/2000 | Tench et al. .................. | 62/50.7 |
| 6,317,303 B1 | * | 11/2001 | Zeigler et al. ................ | 361/19 |
| 6,396,377 B1 | * | 5/2002 | Ying .......................... | 335/300 |
| 6,477,855 B1 | * | 11/2002 | Findley et al. ................ | 62/434 |

FOREIGN PATENT DOCUMENTS

| | | |
|---|---|---|
| DE | 35 25 938 | 1/1986 |
| JP | 01117004 A * 5/1989 | ............. H01F/7/22 |
| JP | 11-340533 | 12/1999 |
| JP | 2002222619 A * 8/2002 | ........... H01B/13/00 |
| JP | 2003037303 A * 2/2003 | ........... H01L/39/20 |

OTHER PUBLICATIONS

Wang et al., "Study of Full–Wave Superconducting Rectifier–type Flux–Pumps", IEEE Transactions on Magnetics, vol. 32, No. 4, Jul. 1996, pp. 2699–2702.
Nagamatsu, et al., "Superconductivity at 39K in Magnesium Diboride", Nature, vol. 410, Mar. 1, 2001, pp. 63–64.
Jin et al., "High critical currents in iron–clad superconducting $MgB_2$ wires", Nature, vol. 411, May 31, 2001, pp. 563–565.
Eom et al., "High critical current density and enhanced irreversibility field in superconducting $MgB_2$ thins films", Nature, vol. 411, May 31, 2001, pp. 558–560.
Bud'ko et al., "Temperature–dependent $H_{c2}$ anisotrophy in $MgB_2$ as inferred from measurements on polycrystals", Physical Review B, vol. 65, 2002, pp.212501–1 to 212503–3 (no date).
Patent Abstract of Japan 1–194310, for Japanese Application 63–16967, published Aug. 4, 1989.

* cited by examiner

Primary Examiner—Lincoln Donovan
Assistant Examiner—Bernard Rojas
(74) Attorney, Agent, or Firm—Staas & Halsey LLP

(57) ABSTRACT

A switching path having superconducting material in a switching device may be cooled to a predetermined superconducting operating temperature. The switching device includes a mechanism for exceeding at least one of the critical values of the superconducting material in a controlled manner to change the switching path from the superconducting state to the normally conductive state. The switching device may have an operating temperature of below 40 K, and contain magnesium diboride as the superconducting material for its switching path.

12 Claims, 1 Drawing Sheet

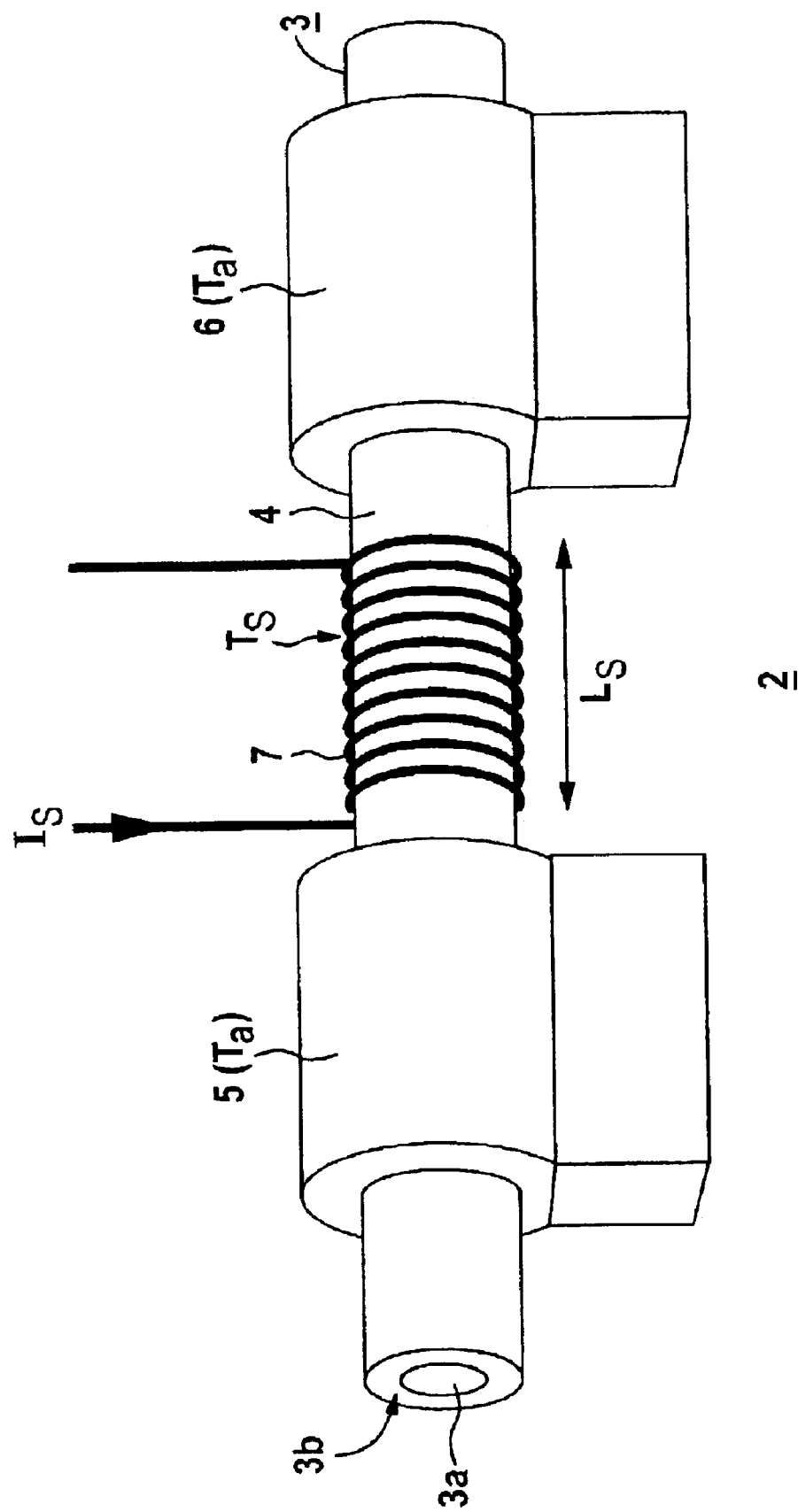

SWITCHING DEVICE FOR SUPERCONDUCTING TECHNOLOGY

CROSS REFERENCE TO RELATED APPLICATIONS

This application is based on and hereby claims priority to German Application No. 102 01 322.5 filed on Jan. 15, 2002, the contents of which are hereby incorporated by reference.

BACKGROUND OF THE INVENTION

The invention relates to a switching device for superconducting technology having a switching path which has a superconducting material, a mechanism for cooling the switching path to a predetermined operating temperature and a mechanism for exceeding at least one of the critical values of the superconducting material in a controlled manner to change the switching path from the superconducting state to the normally conductive state. A corresponding switching device is disclosed in DE 35 25 938 A1.

Superconducting switching devices have been developed for various superconducting technology apparatuses with conductors composed of traditional (metallic) superconductor material. Thus, for example, a switching device is known for a flow pump for excitation of a superconducting magnet (see, for example "IEEE Transactions on Magnetics", Vol. 32, No. 4, July 1996, pages 2699 to 2702). Switching devices such as these are also provided for short-circuiting of magnetics such as those for MRI apparatuses or for energy storage devices. Corresponding switching devices generally have a switching path which is formed by a superconductor and is cooled to a predetermined temperature. This switching path can be changed from the superconducting state to the normally conductive state by deliberately exceeding at least one critical value of the superconductor material that is used, in particular the critical temperature or the critical magnetic field, or both. The switching device which is disclosed in the abovementioned DE-A document is of this type.

With the development of the new high $T_C$ superconductor materials (HTS materials) which are based on metal oxides, conductors for superconducting apparatuses are now also available which allow operation at considerably higher temperatures than is possible for the traditional superconductor materials. Superconducting switching devices have also been designed for apparatuses such as these. For example, U.S. Pat. No. 5,350,739 A discloses a microwave switch with a switching path composed of HTS material, which is located between two conductor parts composed of the appropriate HTS material. The switching path has associated heating device, to produce a transition from the superconducting state to the normally conductive state. A switching device which is disclosed in JP 11-340533 A is also of the corresponding type. In the switching device which is disclosed in U.S. Pat. No. 5,805,036 A and which uses HTS material, the switching process is produced by a magnetic field.

Some apparatuses with HTS conductors are intended to be operated below the temperature of about 77 K at which nitrogen becomes liquid. Switching devices with superconductive switching paths which can be changed from the superconducting to the normally conductive state at short notice may also be required for apparatuses such as these. Until now, the same HTS material as that used in the superconducting apparatus which is connected to it has generally been provided as the superconducting material for corresponding switching paths. The HTS material is in this case normally applied in the form of a layer to a mount which is suitable for this purpose.

However, it has been found that a number of problems can occur in corresponding embodiments of HTS switching paths, in particular such as thermal inertia resulting from the relatively large mass of the mount or substrate that is used for the HTS material and owing to the fact that there may be a relatively large difference between a chosen operating temperature of, for example, below 40 K and a critical temperature of the HTS material of about 90 K or more, difficulty in making contact owing to the sensitivity of the layer composed of the HTS material that is used and of a thin covering layer which can be applied to this layer and is composed of a contact-making material such as gold, the risk of burning through excessively thin layers, relatively complex material production, and difficulty in coupling the switching device, such as a thermal heater to the HTS layer which is to be switched.

SUMMARY OF THE INVENTION

An aspect of the present invention is therefore to refine the switching device having the features mentioned initially such that the abovementioned difficulties are at least partially reduced.

According to the invention, this aspect may be achieved by providing magnesium diboride ($MgB_2$) as the superconducting material for the switching path.

The superconducting compound ($MgB_2$) has a critical temperature $T_C$ of approximately 39 K (see "Nature", Vol. 410, Mar. 1, 2001, pages 63 and 54). This material has been identified as being particularly highly suitable for a switching device for superconducting technology with an operating temperature of below 40 K, in particular when operation is envisaged with cooling without the use of any coolant. Wires or thin layers can be produced from the cited material without any problems, in order to be used as the switching path. It is also advantageous that the known superconducting material or a sheath material surrounding it can be made contact with without any major difficulties.

For example, a wire with a round or rectangular cross section can be provided, in particular, for the superconducting switching path, which has a superconducting core composed of magnesium diboride, and has a non-superconducting metallic sheath. In this case, the sheath may advantageously be composed of iron or steel.

It is particularly advantageous for the mechanism for exceeding at least one of the critical values of the superconducting material in a controlled manner to be a control winding which surrounds the switching path. A control winding such as this allows the superconducting material to be subjected to a sufficient temperature increase and/or to a magnetic field in order to change, in a simple manner, from the superconducting state to the normally conductive state.

If the cooling system is designed without the use of coolant, a cooling machine can advantageously be thermally coupled to those parts of the switching device which need to be cooled.

Furthermore, to bound the switching path, it is advantageous for this switching path to be arranged between the heat sinks. This prevents undesirable broadening of the switching area of the superconducting material. Solid blocks or other solid bodies composed of a highly thermally conductive material are suitable for use as the heat sinks, which advantageously make a highly thermally conductive contact with the superconducting material, for example surrounding it.

BRIEF DESCRIPTION OF THE DRAWINGS

These and other objects and advantages of the present invention will become more apparent and more readily appreciated from the following description of the preferred embodiments, taken in conjunction with the accompanying drawing which is The only FIGURE is a perspective view of a switching device.

DETAILED DESCRIPTION OF THE PREFERRED EMBODIMENT

Reference will now be made in detail to the preferred embodiments of the present invention, examples of which are illustrated in the accompanying drawings, wherein like reference numerals refer to like elements throughout.

The superconducting switching path of the switching device according to the invention is intended to use the compound $MgB_2$ as the superconducting material. Wires can be produced from this material (see "Nature", Vol. 411, May 31, 2001, pages 563 to 565). The material is also suitable for producing thin layers (see "Nature", Vol. 411, May 31, 2001, pages 558 to 560). When producing wires, in particular using the so-called powder in tube method as is known in particular for the production of HTS wires, sheathing materials composed of iron and steel can be regarded, above all, as being advantageous. The wires may in this case have a round or rectangular cross section.

A corresponding wire composed of $MgB_2$ is intended to be provided for the switching device which is illustrated in the FIGURE and annotated in general by 2. The wire 3 in this case has a core 3a composed of the superconducting compound $MgB_2$, which is surrounded by a metallic sheath 3b, for example composed of iron or steel. One subregion of the wire with an axial length Ls is intended to represent a superconducting switching path 4. For this purpose, the wire is surrounded at the ends of this switching path by relatively large-volume heat sinks 5 and 6, respectively, which are, by way of example, two solid blocks composed of a highly thermally conductive material such as copper. The heat sinks can preferably be thermally connected to a cooling machine, for example to a cooling head of this machine, to ensure a working or operating temperature $T_A$ at the ends of the switching path 4 which is below the critical temperature $T_C$ of approximately 39 K of the superconducting core material.

Furthermore, a mechanism is provided in the area of the switching path 4 to exceed at least one of the critical values of the superconducting material there in a controlled manner, that is to say the critical temperature $T_C$ and/or the critical magnetic field $H_C$. According to the illustrated exemplary embodiment, a control winding 7 is therefore provided which is, for example, wound around the wire 3 in the region of the switching path, and which can operate as a heating coil or as a magnet coil. This control winding 7 can be wound onto the wire 3 relatively easily, and can thus be thermally connected to it well.

The following operating methods may be used for operation of the switching device 2 or of its switching path 4, and may be referred to as (a) "thermal switching",
(b) "magnetic switching", or
(c) "thermal-magnetic switching".

When no current $I_S$ is flowing through the control winding 7, then the temperature of the switching device in the region of the switching path is $T_S < T_C$, so that the switching device with its wire 3 is in the superconducting state and no voltage drop is evident across the switching device. If, in contrast, a current $I_S$, is applied to the control winding 7, then either the temperature $T_S$, of the switching path in the region of the control winding is increased ($T_S > T_C$) by thermal heating in accordance with method a), or the critical temperature is reduced to ($T_S > T_C$ (B)) by the magnetic field produced by the control winding 7 in accordance with method (b), or the temperature of the switching path is raised and the critical temperature is reduced by the combined effect in accordance with method c) to such an extent that the switching path changes from the superconducting state to the normally conductive state so that a resistive voltage drop occurs between the ends of the switching path 4 of the wire 3 when an external voltage or an external current is applied.

The rated current $I_N$ of the switching device 2 at a given operating temperature $T_N$ may be set as follows by suitable selection of the superconductor cross section $A_{SL}$ of the superconductor material of the wire 3 in its core 3a:

$$I_N \leq I_C(T_N) \approx A_{SL} \cdot J_C(T_N),$$

where $I_C(T_N)$ is the temperature-dependent critical current and $J_C(T_N)$ is the temperature-dependent critical current density of the $MgB_2$ superconductor material at the temperature $T_N$. In the normally conductive state, the current $I_{NL}$ flowing through the switching device and the voltage $U_{NL}$ which is dropped across the switching path 4 are given by the relationship ti $UNL = R + NL \cdot INL$ where $R_{NL}$ is the normally conductive resistance of the wire 3. A specific value of $R_{NL}$ can be set by suitable selection of the metallic sheath 3b for example by the cross-sectional area of the sheath or the material of the sheath, as well as by the length $L_S$ of the driven area of the switching path 4 of the switching device 2.

The cryogenic means for cooling the superconducting wire 3 and its switching path 4 below a maximum operating temperature of 40 K have not been shown in the FIGURE as appropriate means are generally known. The switching device is particularly suitable for operation without any coolant in a temperature range between about 10 K and 40 K. Such operation without any coolant can be maintained using cooling machines such as so-called Cryocoolers, in that cold parts of this machine are thermally coupled to the parts of the switching device which need to be cooled, such as its heat sinks 5 and 6. However, it is, of course, also possible for the superconducting parts of the switching device to be kept at the required temperature by a gaseous or liquid coolant. An appropriate coolant may, for example, be gaseous helium (GHe) or else liquid neon (LNe) at operating temperatures below 27 K.

In contrast to the described embodiment, other means can also be used or arranged for exceeding at least one of the critical values of the superconductor material in a controlled manner. Thus, for example, a control winding which is provided for thermal heating does not necessarily need to surround the switchable area of the superconducting wire. The critical magnetic field can also be exceeded with the aid of a permanent magnet adjacent to the switching path.

The invention has been described in detail with particular reference to preferred embodiments thereof and examples, but it will be understood that variations and modifications can be effected within the spirit and scope of the invention.

What is claimed is:

1. A switching device for superconducting technology, comprising:
    a switching path formed at least in part by a wire having a superconducting core made of magnesium diboride and a sheath made of a non-superconducting metallic material, with a cross section that is one of substantially round and substantially rectangular;
    a cooling machine thermally coupled to parts of the device;
    means, including heat sink means, for cooling the switching path to a predetermined operating temperature of less than 40° K. without using a coolant, the heat sink means including solid blocks composed of a highly thermally conductive material and the switching path being arranged between the heat sink means; and
    means for exceeding at least one critical value of the magnesium diboride in a controlled manner to change the switching path from a superconducting state to a normally conductive state.

2. The switching device as claimed in claim 1, wherein the sheath is composed of at least one of iron and steel.

3. The switching device as claimed in claim 2, wherein said means for exceeding at least one of the critical values of the superconducting material in a controlled manner is a control winding substantially surrounding the switching path.

4. The switching device as claimed in claim 3, wherein said control winding allows the superconducting material to be subjected to at least one of a temperature rise and a magnetic field to change from the superconducting state to the normally conductive state.

5. A switching device for superconducting technology, comprising:
    a switching path formed at least in part by magnesium diboride;
    a cooling machine thermally coupled to parts of said switching device;
    a cooling device, including heat sinks, to cool the switching path to a predetermined operating temperature of less than 40° K. without using a coolant, the switching path being arranged between the heat sinks; and
    a control device to permit at least one critical value of the magnesium diboride to be exceeded in a controlled manner to change the switching path from a superconducting state to a normally conductive state.

6. The switching device as claimed in claim 5, wherein said switching path includes a wire with a cross section that is one of substantially round and substantially rectangular.

7. The switching device as claimed in claim 6, wherein the wire has a superconducting core made of magnesium diboride and a sheath made of a non-superconducting metallic material.

8. The switching device as claimed in claim 7, wherein the sheath is composed of at least one of iron and steel.

9. The switching device as claimed in claim 8, wherein said control device is a control winding substantially surrounding the switching path.

10. The switching device as claimed in claim 9, wherein said control winding allows the superconducting material to be subjected to at least one of a temperature rise and a magnetic field to change from the superconducting state to the normally conductive state.

11. The device as claimed in claim 10, wherein the heat sinks posed of a highly thermally conductive material.

12. A superconductive switching device, comprising:
    a switching path formed at least in part by magnesium diboride;
    a cooling mechanism, including heat sinks thermally coupled to said switching path, to cool said switching path to a predetermined operating temperature of less than 40° K. without immersing said switching path in a coolant; and
    a control device, coupled to said cooling mechanism, to permit at least one critical value of the magnesium diboride to be exceeded in a controlled manner to change said switching path from a superconductive state to a normally conductive state.

* * * * *